United States Patent
Nakamura

(10) Patent No.: US 9,530,919 B2
(45) Date of Patent: Dec. 27, 2016

(54) SOLAR CELL MODULE

(71) Applicant: Panasonic Intellectual Property Management Co., Ltd., Osaka (JP)

(72) Inventor: Kei Nakamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/051,656

(22) Filed: Feb. 23, 2016

(65) Prior Publication Data

US 2016/0172520 A1 Jun. 16, 2016

Related U.S. Application Data

(63) Continuation of application No. PCT/JP2014/073543, filed on Sep. 5, 2014.

(30) Foreign Application Priority Data

Sep. 25, 2013 (JP) .................. 2013-198399

(51) Int. Cl.
*H01L 31/042* (2014.01)
*H01L 31/05* (2014.01)

(52) U.S. Cl.
CPC ............ *H01L 31/0508* (2013.01); *Y02E 10/50* (2013.01)

(58) Field of Classification Search
CPC .................................................. H01L 31/0508
USPC ......................................................... 136/244
See application file for complete search history.

(56) References Cited

U.S. PATENT DOCUMENTS

| 6,184,457 | B1 | 2/2001 | Tsuzuki et al. |
| 6,479,744 | B1 | 11/2002 | Tsuzuki et al. |
| 2007/0074756 | A1* | 4/2007 | Yagiura ............. H01L 31/03528 136/244 |
| 2012/0240980 | A1* | 9/2012 | Bartholomeusz ... H01L 31/0326 136/249 |

FOREIGN PATENT DOCUMENTS

JP    H11-186572 A    7/1999

* cited by examiner

*Primary Examiner* — Jayne Mershon

(57) ABSTRACT

A solar cell module includes a solar cell string including solar cells disposed in an arrangement direction and at least two wiring members provided to extend along the arrangement direction in order to electrically connect the solar cells. The at least two wiring members include a first wiring member disposed at a first position where a distance between the solar cells adjacent to each other is short and a second wiring member disposed at a second position where the distance between the solar cells adjacent to each other is long. The respective first and second wiring members include bent portions between the solar cells. Between edge portions of the solar cells facing each other, the first wiring member has a slope whose maximum value is larger than the maximum value of a slope of the second wiring member.

5 Claims, 6 Drawing Sheets

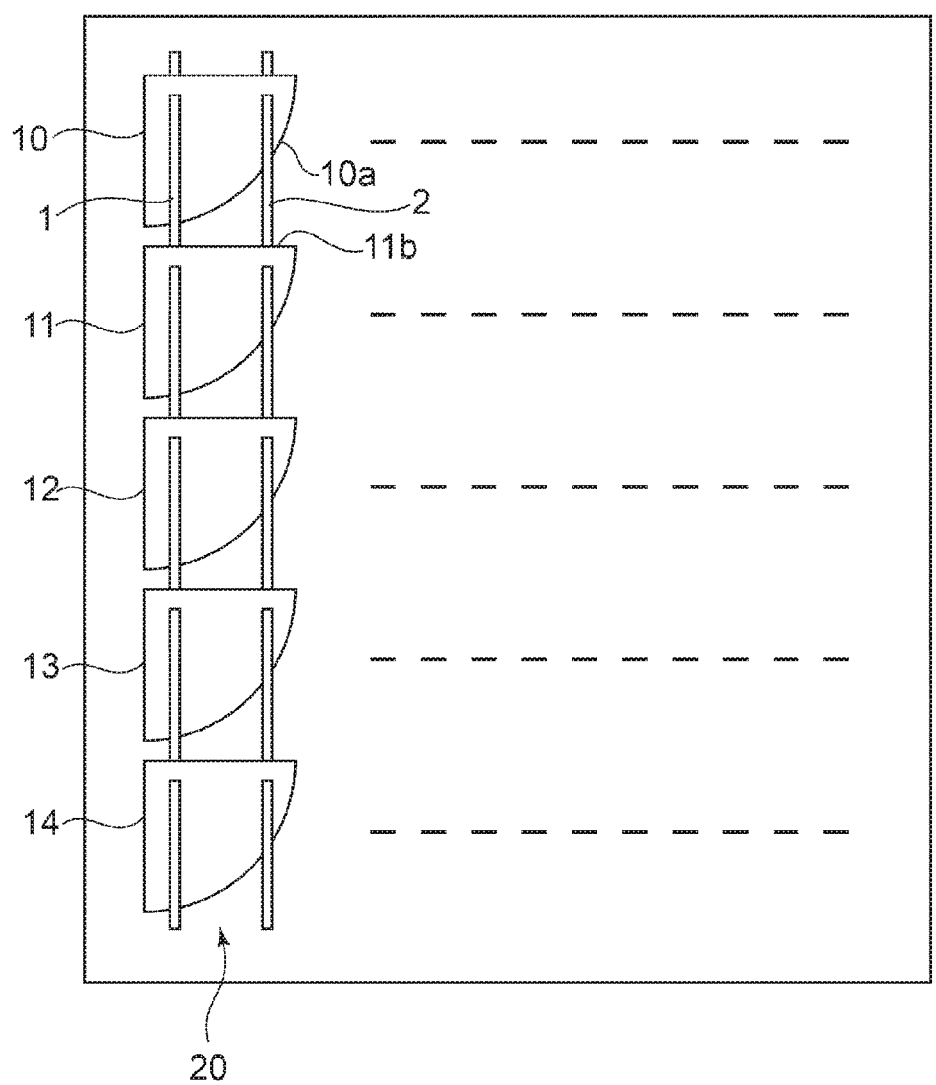

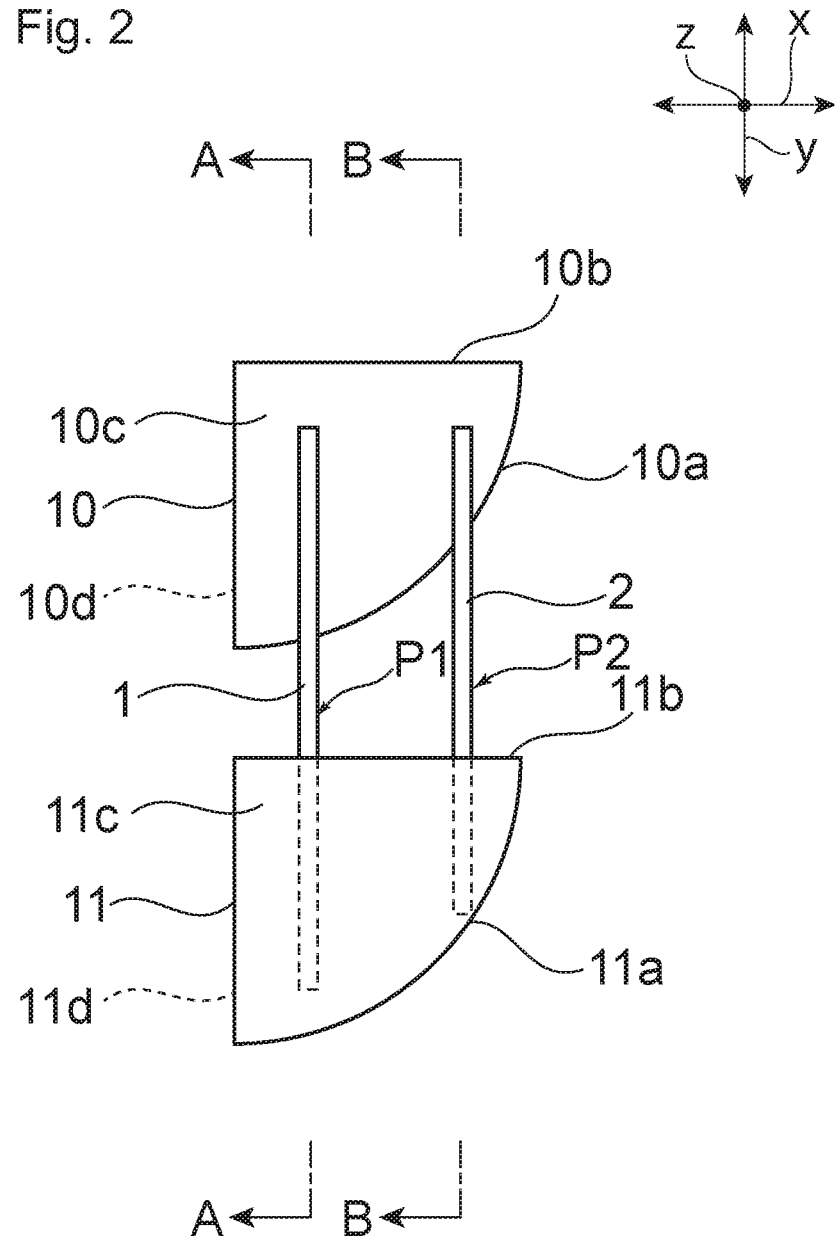

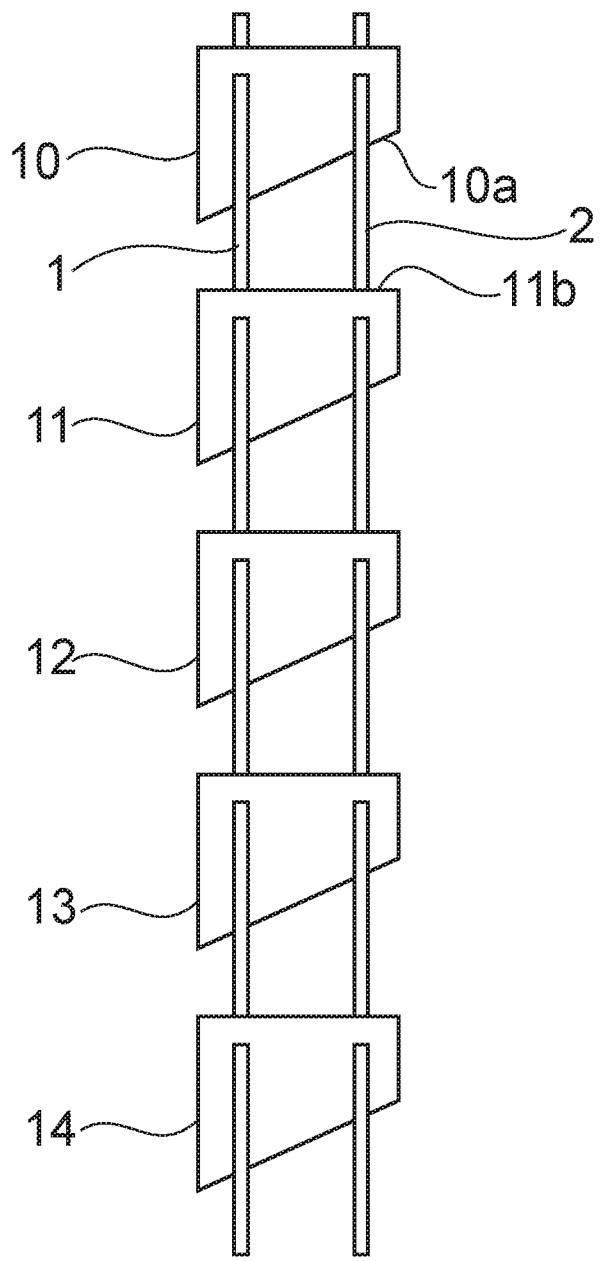

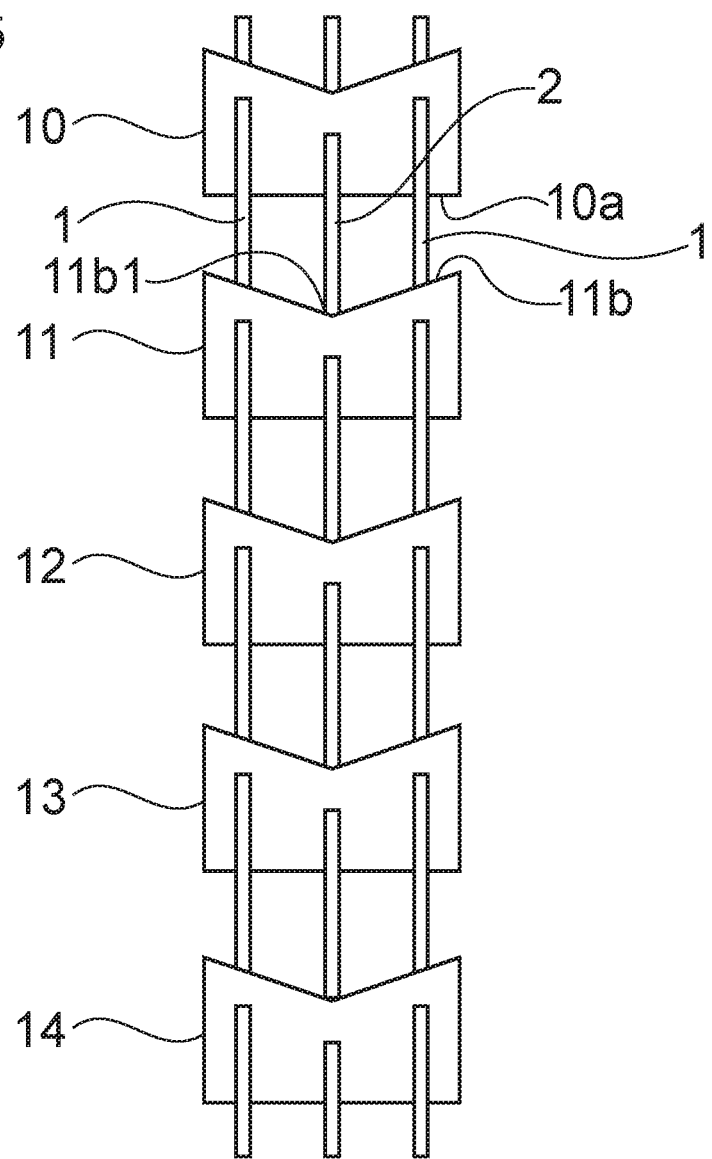

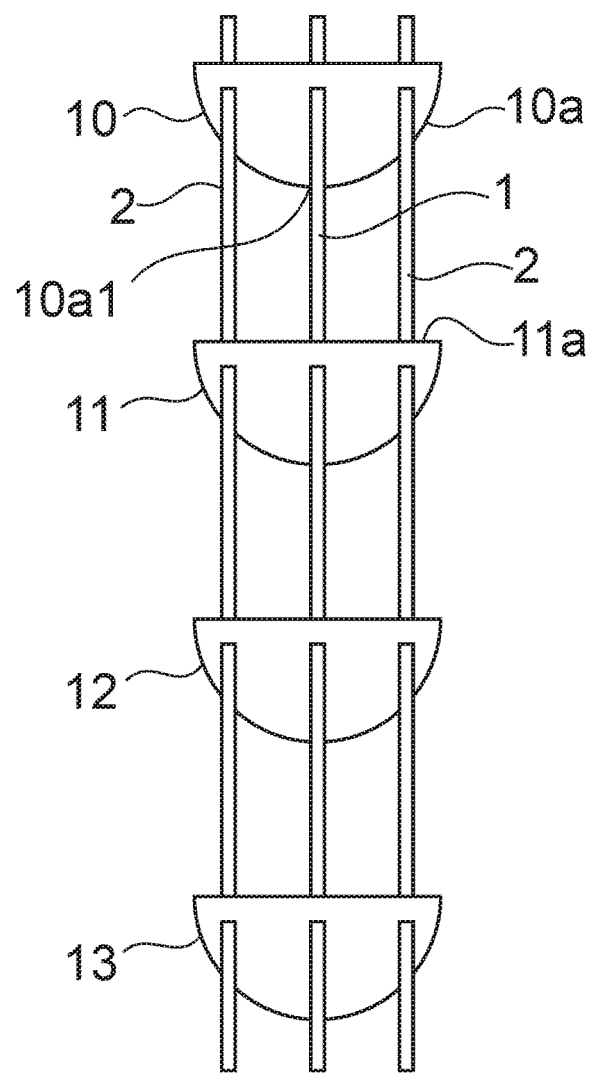

SOLAR CELL MODULE

CROSS REFERENCE TO RELATED APPLICATIONS

This application is a continuation application of International Application No. PCT/JP2014/073543, filed on Sep. 5, 2014, entitled "SOLAR CELL MODULE", which claims priority based on the Article 8 of Patent Cooperation Treaty from prior Japanese Patent Application No. 2013-198399, filed on Sep. 25, 2013, the entire contents of which are incorporated herein by reference.

BACKGROUND OF THE INVENTION

1. Technical Field

This disclosure relates to a solar cell module.

2. Background Art

In a solar cell module, solar cells are arranged in a predetermined direction, and the adjacent solar cells are electrically connected to each other by wiring members. Patent Literature 1 discloses a solar cell module having circular solar cells electrically connected to each other by a wiring member. In Patent Literature 1, the solar cells are connected by a single wiring member.

PATENT LITERATURE

PTL 1

Japanese Patent Application Publication No. Hei 11-186572

SUMMARY OF INVENTION

However, when the circular solar cells are connected by two or more wiring members, the wiring members may be different from each other in distance between the edge portions of the solar cells, since the circular solar cells have arc-like edge portions. In the solar cell module, a stress caused by thermal expansion due to repeated temperature changes is applied to the wiring members between the solar cells. To be more specific, the uppermost covering member, the bonding material, the lowermost covering member and the solar cells mentioned in Patent Literature 1 have thermal expansion coefficients different from each other, and thus their absolute amounts of thermal expansion and thermal contraction are different. A stress caused by such a difference in thermal expansion or thermal contraction may be absorbed by a material having low rigidity. To be more specific, in the direction along the uppermost covering member, such a stress concentrates on the wiring member provided between the edge portions of the solar cells and connecting the solar cells. When the edge portions of the solar cells included in the solar cell module are not approximately parallel to each other, the length of the wiring member between the solar cells is also short in a portion where the distance between the edge portions of the solar cells is short. Therefore, there is a problem that a larger stress concentrates on the wiring member between the solar cells in the portion where the distance between the edge portions of the solar cells is short.

It is an object of an embodiment of the invention to provide a solar cell module in which wiring members are different in distance between solar cells and the concentration of a larger stress on the wiring members due to repeated temperature changes can be reduced.

An aspect of the invention is a solar cell module comprising: a solar cell string including solar cells disposed in an arrangement direction and at least two wiring members provided so as to extend along the arrangement direction in order to electrically connect the solar cells, wherein the at least two wiring members include a first wiring member disposed at a first position where the distance between the solar cells adjacent to each other is short and a second wiring member disposed at a second position where the distance between the solar cells adjacent to each other is long, and the first and second wiring members respectively includes bent portions between the solar cells, and between edge portions of the solar cells facing each other, the first wiring member has a slope whose maximum value is larger than the maximum value of a slope of the second wiring member.

The aspect of the invention can reduce the concentration of a larger stress on the wiring members due to repeated temperature changes.

BRIEF DESCRIPTION OF DRAWINGS

FIG. 1 is a schematic plan view illustrating a solar cell module according to a first embodiment.

FIG. 2 is a schematic enlarged plan view illustrating between solar cells in the solar cell module according to the first embodiment.

FIG. 4 is a schematic plan view illustrating a solar cell string in a solar cell module according to a second embodiment.

FIG. 5 is a schematic plan view illustrating a solar cell string in a solar cell module according to a third embodiment.

FIG. 6 is a schematic plan view illustrating a solar cell string in a solar cell module according to a fourth embodiment.

DESCRIPTION OF EMBODIMENTS

Figure 3A:
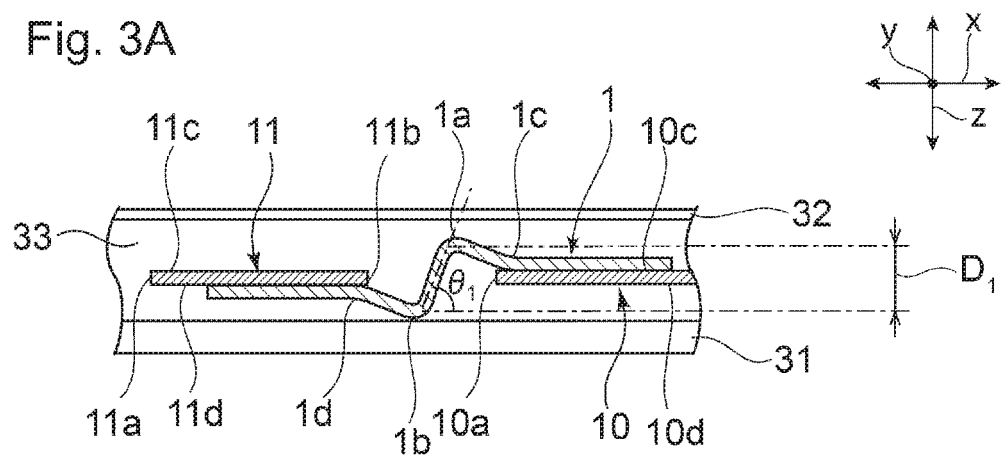
FIG. 3A is a schematic cross-sectional view taken along the line A-A illustrated in FIG. 2.

Hereinafter, preferred embodiments are described. However, the following embodiments are for illustrative purposes only, and the invention is not limited to the following embodiments. Moreover, in the respective drawings, members having substantially the same functions may be denoted by the same reference numerals.

FIG. 1 is a schematic plan view illustrating a solar cell module according to a first embodiment. As illustrated in FIG. 1, solar cells 10 to 14 are arranged in a y-direction in solar cell module 30. Each of solar cells 10 to 14 has a shape obtained by dividing a circle into quarters along lines passing through the center. Between solar cells 10 and 11, first wiring member 1 and second wiring member 2 are provided. First wiring member 1 and second wiring member 2 are arranged in an x-direction approximately perpendicular to the y-direction that is the arrangement direction of the solar cells. The first wiring member and the second wiring member are also similarly provided between solar cells 11 and 12, between solar cells 12 and 13 and between solar cells 13 and 14. Solar cell string 20 is configured by electrically connecting between solar cells 10 to 14 through the wiring members. In solar cell module 30, such solar cell strings 20 are arranged in the x-direction approximately perpendicular to the y-direction that is the arrangement direction of the solar cells, and are electrically connected to each other.

FIG. 2 is a schematic enlarged plan view illustrating between solar cells 10 and 11 in solar cell module 30 according to the first embodiment. As illustrated in FIG. 2, one end of first wiring member 1 is electrically connected to an electrode on the first principal surface 10c side of solar cell 10, and the other end thereof is electrically connected to an electrode on the second principal surface 11d side of solar cell 11. Similarly, one end of second wiring member 2 is electrically connected to the electrode on the first principal surface 10c side of solar cell 10, and the other end thereof is electrically connected to the electrode on the second principal surface 11d side of solar cell 11. In this embodiment, second principal surface 10d is mainly the surface that receives incident light, while first principal surface 10c is the surface opposite to the surface that receives the incident light. Solar cell module 30 generates power when a light source such as the sun and first principal surface 10d are disposed so as to face each other.

In this embodiment, a finger electrode (not illustrated) extending in the x-direction is formed on first principal surface 10c of solar cell 10, and a bus bar electrode (not illustrated) electrically connected to the finger electrode is formed in a direction (y-direction) approximately perpendicular to the extending direction of the finger electrode. The one ends of first and second wiring members 1 and 2 are electrically connected to the bus bar electrode. A finger electrode and a bus bar electrode are also formed similarly on second principal surface 11d of solar cell 11, and the other ends of first and second wiring members 1 and 2 are electrically connected to the bus bar electrode.

The same finger electrode and bus bar electrode are also formed on second principal surface 10d of solar cell 10 and first principal surface 11c of solar cell 11.

Note that the configurations of the bus bar electrode and finger electrode are not limited to those described above. The invention may have a configuration including both of or any one of the electrodes, or may adopt an electrode formed on the entire principal surface of the solar cells.

Between solar cells 10 and 11 adjacent to each other, arc-like edge portion 10a of solar cell 10 and linear edge portion 11b of solar cell 11 face each other. First wiring member 1 is disposed at first position P1 where the distance between solar cells 10 and 11 adjacent to each other, i.e., the distance between edge portion 10a and edge portion 11b is short. Second wiring member 2 is disposed at second position P2 where the distance between solar cells 10 and 11 adjacent to each other, i.e., the distance between edge portion 10a and edge portion 11b is long.

Note that, in FIGS. 2 and 3, first principal surface 11c of solar cell 11 and a second principal surface of solar cell 12 are electrically connected by unillustrated wiring members. The connection between solar cells 11 and 12 has the same configuration as that of the connection between solar cells 10 and 11. Solar cell string 20 including three or more solar cells is configured by repeatedly providing the configuration of the connection between solar cells 10 and 11 as described above.

Figure 3B:
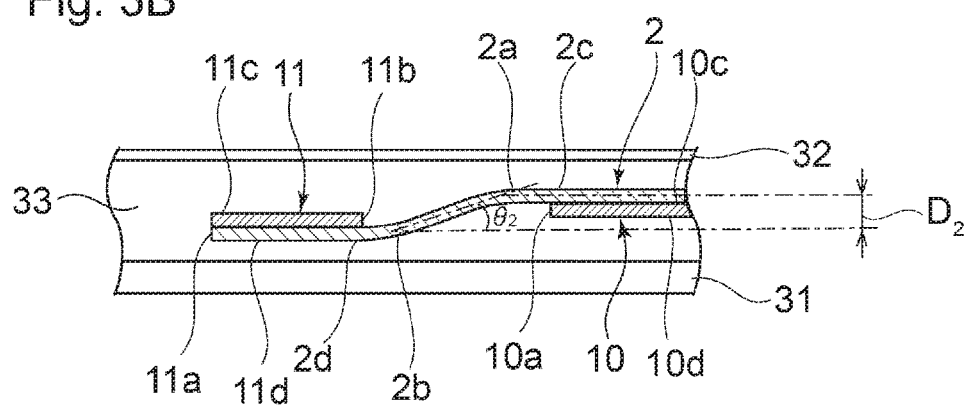
FIG. 3B is a schematic cross-sectional view taken along the line B-B illustrated in FIG.

FIG. 3A is a schematic cross-sectional view taken along the line A-A illustrated in FIG. 2, and FIG. 3B is a schematic cross-sectional view taken along the line B-B illustrated in FIG. 2. As illustrated in FIGS. 3A and 3B, solar cells 10 and 11 are disposed between front-side protective member 31 and back-side protective member 32, and are sealed in bonding layer 33 provided therebetween. As front protective member 31, a transparent base material is used, such as a glass plate, an acrylic plate and a polycarbonate plate. As back-side protective member 32, a glass plate, a resin sheet, a resin film, a resin plate, or the like is used. Bonding layer 33 can be made of cross-linked resin such as ethylene vinyl acetate (EVA) copolymer, non-cross-linked resin such as polyolefin, or the like. In this embodiment, front-side protective member 31 serves as a light receiving-side protective member.

As illustrated in FIG. 3A, one end of first wiring member 1 is connected to the electrode on the first principal surface 10c side of solar cell 10, and the other end thereof is connected to the electrode on the second principal surface 11d side of solar cell 11. In first wiring member 1 between solar cells 10 and 11, first bent portion 1a and second bent portion 1b are formed.

As illustrated in FIG. 3B, one end of second wiring member 2 is connected to the electrode on the first principal surface 10c side of solar cell 10, and the other end thereof is connected to the electrode on the second principal surface 11d side of solar cell 11. In second wiring member 2 between solar cells 10 and 11, first bent portion 2a and second bent portion 2b are formed.

The bent shape at first and second bent portions 1a and 1b of first wiring member 1 illustrated in FIG. 3A is different from the bent shape at first and second bent portions 2a and 2b of second wiring member 2 illustrated in FIG. 3B. To be more specific, between the edge portions of solar cells 10 and 11 in the arrangement direction (x-direction) of solar cells 10 and 11, the maximum value $\theta_1$ of the slope of first wiring member 1 is larger than the maximum value $\theta_2$ of the slope of second wiring member 2. The slope of the wiring member is specified at any coordinates on the x-z plane defined by the arrangement direction (x-direction) of solar cells 10 and 11 and the direction (z-direction) perpendicular to front-side protective member 31. The maximum value $\theta_1$ of the slope of wiring member 1 illustrated in FIG. 3A is the maximum value of the slope of wiring member 1 based on the arrangement direction (x-direction) of solar cells 10 and 11. Likewise, the maximum value $\theta_2$ of the slope of wiring member 2 illustrated in FIG. 3B is the maximum value of the slope of wiring member 2 based on the arrangement direction (x-direction) of solar cells 10 and 11. Note that the maximum value of the slope is the maximum value of the absolute value of the slope irrespective of whether the value is positive or negative. In this event, distance $D_1$ between first and second bent portions 1a and 1b of first wiring member 1 is larger than distance $D_2$ between first and second bent portions 2a and 2b of second wiring member 2.

The difference in maximum value of the slope between first and second wiring members 1 and 2 between solar cells 10 and 11 can reduce the difference in length between first and second wiring members 1 and 2, which is caused by the difference in distance between edge portions 10a and 11b. It is preferable that the first wiring member and the second wiring member have approximately the same length between edge portion 1c of the connection to solar cell 10 and edge portion 1d of the connection to solar cell 11. In other words, the length between edge portion 1c and edge portion 1d is set approximately the same as the length between edge portion 2c and edge portion 2d.

Therefore, in this embodiment, the maximum value of the slope of first wiring member 1 disposed at first position P1 where the distance between solar cells 10 and 11 adjacent to each other is short is larger than the maximum value of the slope of second wiring member 2 disposed at second position P2 where the distance between solar cells 10 and 11 adjacent to each other is long. Due to thermal expansion of the solar cell module, a stress per unit length to be applied to first wiring member 1 disposed at first position P1 where the distance between solar cells 10 and 11 is short is larger than a stress per unit length to be applied to second wiring member 2 disposed at second position P2 where the distance between solar cells 10 and 11 is long. In this embodiment, the maximum value of the slope of first wiring member 1, on which the stress caused by the thermal expansion of the solar cells is likely to concentrate, is set large, and the stress per unit length can be reduced even if the stress is applied to first wiring member 1 by the thermal expansion. When the length of first wiring member 1 is set approximately the same as that of second wiring member 2 between solar cells 10 and 11, the stress per unit length on first wiring member 1 can be set approximately the same as that on second wiring member 2. Therefore, the concentration of a larger stress on first wiring member 1 can be reduced.

Note that, in the invention, the distance between solar cells 10 and 11 means the distance along front-side protective member 31.

FIG. 4 is a schematic plan view illustrating a solar cell string in a solar cell module according to a second embodiment. In this embodiment, each of solar cells 10 to 14 has a trapezoidal shape. In this embodiment, again, the maximum value of the slope of first wiring member 1 is set larger than the maximum value of the slope of second wiring member 2 between the edge portion of solar cell 10 and the edge portion of solar cell 11 in the arrangement direction of solar cells 10 and 11. Thus, the concentration of a larger stress on first wiring member 1 due to thermal expansion of the solar cells can be reduced.

FIG. 5 is a schematic plan view illustrating a solar cell string in a solar cell module according to a third embodiment. In this embodiment, each of solar cells 10 to 14 has a special shape. Such a special shape is described focusing on solar cell 11. Solar cell 11 has a shape in which center 11$b$1 of edge portion 11$b$ is recessed inward. Thus, the edge portions of the solar cells are not approximately parallel to each other. To be more specific, the distances between the cell edge portions in the arrangement direction at both ends of edge portion 11$b$ of solar cell 11 are shorter than the distance between the cell edge portions in the arrangement direction at center 11$b$1 of edge portion 11$b$ of solar cell 11. Second wiring member 2 is positioned in the center, and first wiring members 1 are positioned on both sides thereof. In this embodiment, again, the maximum value of the slope of first wiring member 1 is set larger than the maximum value of the slope of second wiring member 2 between the edge portion of solar cell 10 and the edge portion of solar cell 11 in the arrangement direction of solar cells 10 and 11. Thus, the concentration of a larger stress on first wiring member 1 due to thermal expansion of the solar cells can be reduced.

FIG. 6 is a schematic plan view illustrating a solar cell string in a solar cell module according to a fourth embodiment. In this embodiment, each of solar cells 10 to 14 has a semicircular shape. Solar cell 10 has a shape in which center 10$a$1 of edge portion 10$a$ bulges outward. First wiring member 1 is positioned in the center, and second wiring members 2 are positioned on both sides thereof. In this embodiment, again, the maximum value of the slope of first wiring member 1 is set larger than the maximum value of the slope of second wiring member 2 between the edge portion of solar cell 10 and the edge portion of solar cell 11 in the arrangement direction of solar cells 10 and 11. Thus, the concentration of a larger stress on first wiring member 1 due to thermal expansion of the solar cells can be reduced.

In the above embodiments, the description is given of the examples where edge portion 10$a$ of solar cell 10 has a linear or non-linear shape and edge portion 11$b$ of solar cell 11 has a non-linear or linear shape. However, the invention is not limited thereto. Edge portion 10$a$ and edge portion 11 may both have a non-linear shape. The invention is applicable to the case where the distances between the edge portions are different in the solar cells adjacent to each other in the direction (x-direction) along the surface of front-side protective member 31. Also, in the above embodiments, the description is given of the examples where two to three wiring members are provided. However, the invention is not limited thereto. The invention is also applicable even when there are four or more wiring members. Moreover, in the above embodiments, the description is given of the examples where front-side protective member 31 has a flat plate shape. However, the invention is not limited thereto.

Furthermore, in the above embodiments, the maximum value of the slope of first wiring member 1 is set larger than the maximum value of the slope of second wiring member 2 between the edge portion of solar cell 10 and the edge portion of solar cell 11 in the arrangement direction of solar cells 10 and 11. Also, in the direction (z-direction) perpendicular to front-side protective member 31, the distance between first and second bent portions 1$a$ and 1$b$ of first wiring member 1 is set larger than the distance between first and second bent portions 2$a$ and 2$b$ of second wiring member 2. However, the invention is not limited thereto. The object of the invention can also be achieved by controlling only the maximum values of the slopes of first and second wiring members 1 and 2. Alternatively, the object of the invention can also be achieved by controlling only the distance between first and second bent portions 1$a$ and 1$b$ of first wiring member 1 and the distance between first and second bent portions 2$a$ and 2$b$ of second wiring member 2.

REFERENCE SIGNS LIST 1 first wiring member
2 second wiring member
1$a$, 2$a$ first bent portion
1$b$, 2$b$ second bent portion
1$c$, 1$d$, 2$c$, 2$d$ edge portion of connection
10 to 14 solar cell
10$a$, 11$b$ edge portion
10$a$1, 11$b$1 center
10$c$, 11$c$ first principal surface
10$d$, 11$d$ second principal surface
20 solar cell string
30 solar cell module
31 front-side protective member
32 back-side protective member
33 bonding layer

The invention claimed is:
1. A solar cell module, comprising:
a solar cell string including solar cells disposed in an arrangement direction and at least two wiring members provided to extend along the arrangement direction in order to electrically connect the solar cells, wherein
the at least two wiring members include a first wiring member disposed at a first position where a distance between the solar cells adjacent to each other is short and a second wiring member disposed at a second position where the distance between the solar cells adjacent to each other is long, and
the first and second wiring members respectively include bent portions between the solar cells, and
between edge portions of the solar cells facing each other, the first wiring member has a slope whose maximum value is larger than the maximum value of a slope of the second wiring member.

2. The solar cell module according to claim 1, further comprising:
   a front-side protective member and a back-side protective member, and
   a bonding layer configured to seal the solar cell string disposed between the front-side protective member and the back-side protective member, wherein
   the distance between the solar cells adjacent to each other is a length in the arrangement direction along a surface of the front-side protective member.

3. The solar cell module according to claim 2, wherein
   the first wiring member and the second wiring member are arranged side by side in a direction intersecting the arrangement direction, and
   the second wiring member is connected to a center side of the solar cell with respect to the first wiring member in the direction intersecting the arrangement direction.

4. The solar cell module according to claim 2, wherein
   the first wiring member and the second wiring member are arranged side by side in a direction intersecting the arrangement direction, and
   the first wiring member is connected to a center side of the solar cell with respect to the second wiring member in the direction intersecting the arrangement direction.

5. The solar cell module according to claim 1, wherein
   a distance, in a thickness direction of the solar cell, between both ends of the slope of the first wiring member is larger than a distance, in the thickness direction of the solar cell, between both ends of the slope of the second wiring member.

* * * * *